US010944240B2

(12) United States Patent
Price et al.

(10) Patent No.: US 10,944,240 B2
(45) Date of Patent: Mar. 9, 2021

(54) MULTI-SECTION LASER FOR FAST MODULATION AND BROAD SPECTRAL LINEWIDTH

(71) Applicant: MICROSOFT TECHNOLOGY LICENSING, LLC, Redmond, WA (US)

(72) Inventors: Raymond Kirk Price, Redmond, WA (US); Christopher Francis Reidy, Bellevue, WA (US); Kai Zang, Redmond, WA (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 311 days.

(21) Appl. No.: 16/140,968

(22) Filed: Sep. 25, 2018

(65) Prior Publication Data

US 2020/0099194 A1    Mar. 26, 2020

(51) Int. Cl.
*G02B 26/08* (2006.01)
*H01S 5/068* (2006.01)
(Continued)

(52) U.S. Cl.
CPC ...... *H01S 5/06812* (2013.01); *G02B 26/0833* (2013.01); *G02B 26/105* (2013.01);
(Continued)

(58) Field of Classification Search
CPC .. H01S 5/06812; H01S 5/0425; H01S 5/0625; H01S 5/4093; H01S 5/026;
(Continued)

(56) References Cited

U.S. PATENT DOCUMENTS 4,896,325 A   1/1990 Coldren
7,339,962 B2  3/2008 Farrell et al.
(Continued)

FOREIGN PATENT DOCUMENTS

WO    2016044422 A1    3/2016

OTHER PUBLICATIONS

"International Search Report and Written Opinion Issued in PCT Application No. PCT/US2019/039122", dated Sep. 24, 2019, 10 Pages. (Ms# 405107-WO-PCT).
(Continued)

*Primary Examiner* — Euncha P Cherry
(74) *Attorney, Agent, or Firm* — Workman Nydegger

(57) ABSTRACT

Multi-section laser systems are configured with a gain/modulation section and a pre-bias section. Both sections are electrically connected to a diode laser resonator and both sections are independently controllable via laser driver circuitry. The multi-section laser can be used to provide pulsing optimizations that include reducing the turn-on delay of the laser while also ensuring that the resulting laser light's spectral linewidth satisfies a threshold linewidth requirement. During use, a pre-bias current is applied to the pre-bias section. This current causes some photons to be spontaneously emitted. During this time, a gain current is refrained from being applied to the gain section until the resonator is seeded with a spectrum of photons from the pre-bias section. Once the resonator is sufficiently seeded, the gain current is applied to the gain section, thereby producing a seeded pulse of laser light having a desired spectral linewidth.

20 Claims, 10 Drawing Sheets

(51) Int. Cl.
*G02B 26/10* (2006.01)
*G02B 27/01* (2006.01)
*H01S 5/042* (2006.01)
*H01S 5/0625* (2006.01)
*H01S 5/40* (2006.01)
*F21V 8/00* (2006.01)
*H01S 5/026* (2006.01)
*H01S 5/22* (2006.01)
*H01S 5/34* (2006.01)

(52) U.S. Cl.
CPC ........ *G02B 27/0172* (2013.01); *H01S 5/0425* (2013.01); *H01S 5/0625* (2013.01); *H01S 5/4093* (2013.01); *G02B 6/005* (2013.01); *G02B 6/0026* (2013.01); *G02B 2027/012* (2013.01); *G02B 2027/0112* (2013.01); *H01S 5/026* (2013.01); *H01S 5/22* (2013.01); *H01S 5/34* (2013.01)

(58) Field of Classification Search
CPC ... H01S 5/22; H01S 5/34; H01S 5/041; G02B 26/0833; G02B 26/105; G02B 27/0172; G02B 6/0026; G02B 6/005; G02B 2027/0112; G02B 2027/012
USPC ...................................... 359/201.2
See application file for complete search history.

(56) References Cited

U.S. PATENT DOCUMENTS

| | | |
|---|---|---|
| 7,656,914 B1 | 2/2010 | Reid et al. |
| 7,769,063 B2 | 8/2010 | Gollier et al. |
| 2006/0078031 A1 | 4/2006 | Govorkov et al. |
| 2012/0294320 A1 | 11/2012 | Corbett et al. |
| 2013/0182728 A1 | 7/2013 | Li |
| 2013/0258210 A1* | 10/2013 | Kurihara ............. H04N 9/3161 348/750 |
| 2017/0018902 A1 | 1/2017 | Kim et al. |

OTHER PUBLICATIONS

Pochet, et al., "Modulation response of a long-cavity, gainlevered quantum-dot semiconductor laser", In Journal of Optics Express, vol. 22, No. 2, Jan. 17, 2014, pp. 1726-1734.

Usechak, et al., "Modulation effects in multi-section semiconductor lasers", In Proceedings of SPIE, Physics and Simulation of Optoelectronic Devices XIX, vol. 7933, Feb. 21, 2011, 11 Pages.

Werner, et al., "Direct Modulation Capabilities of Micro-Integrated Laser Sources in the Yellow-Green Spectral Range", In Journal of IEEE Photonics Technology Letters, vol. 29, Issue 12, Jun. 15, 2017, pp. 1-4.

* cited by examiner

MULTI-SECTION LASER FOR FAST MODULATION AND BROAD SPECTRAL LINEWIDTH

BACKGROUND

Mixed-reality systems, including virtual-reality (VR) and augmented-reality (AR) systems, have received significant attention because of their ability to create truly unique experiences for their users. For reference, conventional VR systems create a completely immersive experience by restricting their users' views to only virtual environments. This is often achieved through the use of a head-mounted device (HMD) that completely blocks any view of the real world. As a result, a user is entirely immersed within the virtual environment. In contrast, conventional AR systems create an augmented-reality experience by visually presenting virtual images (i.e. "holograms") that are placed in or that interact with the real world.

As used herein, VR and AR systems are described and referenced interchangeably. Unless stated otherwise, the descriptions herein apply equally to all types of mixed-reality systems, which (as detailed above) include AR systems, VR systems, and/or any other similar system capable of displaying virtual images. As used herein, the term "virtual image" collectively refers to images rendered within a VR environment as well as images/holograms rendered in an AR environment.

Some of the disclosed mixed-reality systems use one or more on-body devices (e.g., the HMD, a handheld device, etc.). The HMD provides a display that enables a user to view overlapping and/or integrated visual information (e.g., holograms) in whatever environment the user is in, be it a VR environment, an AR environment, or any other type of environment. Continued advances in hardware capabilities and rendering technologies have greatly improved how mixed-reality systems render holograms. Notwithstanding these advances, the process of immersing a user into a mixed-reality environment creates many challenges, difficulties, and costs, particularly with regard to providing high-quality virtual images to the user.

For instance, methodologies are in place to use a red, green, blue (RGB) laser assembly to visually project one or more virtual images for the user to view and interact with while immersed in a mixed-reality environment/scene. Often, however, the narrow spectral linewidth of laser-based displays cause certain fringe image artifacts (e.g., Newton Rings) to be introduced into those virtual images due to forced attempts of using traditional lasers having suboptimal light coherence characteristics. Such imperfections/image artifacts can negatively impact the display quality and the user's experience. Additionally, there is an on-going need to increase the resolution of the virtual images so as to further improve the user's experience. From this, it will be appreciated that there is a substantial need to improve virtual image quality by both reducing undesired fringe image artifacts and by increasing image resolution.

The subject matter claimed herein is not limited to embodiments that solve any disadvantages or that operate only in environments such as those described above. Rather, this background is only provided to illustrate one exemplary technology area where some embodiments described herein may be practiced.

BRIEF SUMMARY

Disclosed embodiments include systems, methods, and devices configured to control laser driver circuitry in such a way as to reduce a turn-on delay of laser diodes by using a multi-section laser, thus enabling the multi-section laser to generate laser light having a reduced turn-on time and an increased spectral linewidth that satisfies a threshold linewidth requirement of the display system.

In some embodiments, a multi-section laser includes laser driver circuitry and is configured with a gain/modulation section and a pre-bias section. Both sections are electrically connected to a diode laser resonator and both sections are independently controllable using the laser driver circuitry. To facilitate reducing the laser's turn-on delay, while simultaneously providing the desired spectral linewidth characteristics, a minimum threshold amount of pre-bias current is applied to the pre-bias section. Applying this pre-bias current causes photons to be spontaneously emitted. One resulting characteristic of these spontaneously emitted photons is that their wavelengths span a broad range of wavelengths. In some instances, the pre-bias current is applied prior to when the laser pulse is desired. The laser diode resonator is seeded with this pre-bias current for a sufficient time to reduce the turn-on delay of the laser and to increase the spectrum of the resulting laser pulse. Additionally, the laser driver circuitry refrains/delays from applying a gain current to the gain section while applying current to the pre-bias section. This delay occurs, in such instances, until the diode laser resonator is seeded for a predetermined period of time with a spectrum of photons from the pre-bias section.

After the diode laser resonator is seeded with the spectrum of photons, the laser driver circuitry applies the gain current to the gain section to generate a seeded pulse of laser light having a determined optical intensity, where the intensity corresponds to the desired illumination characteristics of a pixel included within a virtual image. This seeded pulse of laser light is generated using at least some of the spectrum of photons that seeded the diode laser resonator. By effectively "seeding" the resonator with photons, the multi-section laser will have an accelerated turn-on rate and will be able to produce spectrally broad laser light.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description which follows, and in part will be obvious from the description, or may be learned by the practice of the teachings herein. Features and advantages of the invention may be realized and obtained by means of the instruments and combinations particularly pointed out in the appended claims. Features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features can be obtained, a more particular description of the subject matter briefly described above will be rendered by reference to specific embodiments which are illustrated in the appended drawings. Understanding that these drawings depict only typical embodiments and are not therefore to be considered to be limiting in scope, embodiments will be described and explained with additional specificity and detail through the use of the accompanying drawings in which.

DETAILED DESCRIPTION

Figure 1:
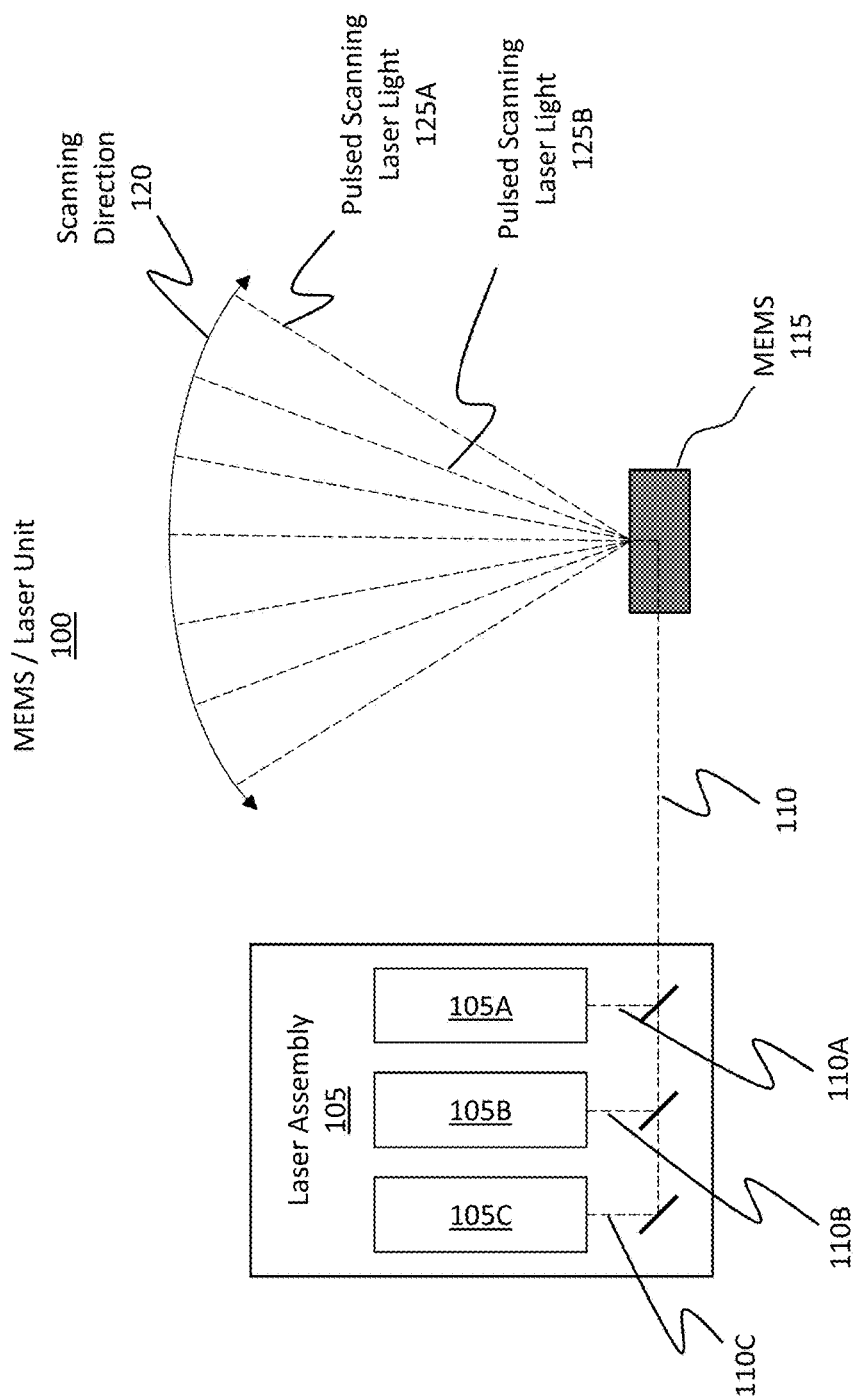
FIG. 1 illustrates how, when a microelectromechanical scanning (MEMS) mirror system is used in conjunction with a laser assembly, any number of virtual images may be rendered in a mixed-reality system.

The disclosed embodiments include systems, methods, and devices that include multi-section lasers and control laser driver circuitry to reduce a turn-on delay associated with the multi-section lasers, and which, thereby, enable/configure the multi-section laser to generate laser light having a spectral linewidth that satisfies a threshold linewidth requirement.

In some embodiments, a multi-section laser is specifically configured with a gain/modulation section and a pre-bias section, as well as laser driver circuitry for independently applying current to the different sections of the laser. Both of the laser sections are electrically connected to a diode laser resonator and are independently controllable via the laser driver circuitry. Initially, a minimum amount/threshold of pre-bias current is applied to the pre-bias section, thereby causing photons to be spontaneously emitted, where these photons' wavelengths span a broad range of wavelengths. During this time, the laser driver circuitry refrains from applying a gain current to the gain section. This delay occurs until the diode laser resonator is seeded with a spectrum of photons from the pre-bias section. After the diode laser resonator is seeded, the laser driver circuitry applies the gain current to the gain section to generate a seeded pulse of laser light having a determined optical intensity. This seeded pulse of laser light is generated using at least some of the spectrum of photons that seeded the diode laser resonator.

The disclosed embodiments provide advantages over conventional multi-section lasers and corresponding techniques for pulsing lasers (including multi-section lasers). For instance, whereas conventional laser devices have turn-on delays of about 5 to 6 nanoseconds, the disclosed embodiments enable a laser device to turn on significantly faster (e.g., less than or equal to 1 nanosecond). Not only are the disclosed embodiments able to turn the laser on faster, but they are also able to beneficially achieve a broader spectral linewidth for the resulting laser light. More specifically, traditional visible light, single mode laser devices operate with spectral linewidths of around 1 nanometer (nm). Using such spectrally tight linewidths often introduces undesired fringe image artifacts (e.g., Newton Rings) into the rendered virtual images. In other words, the resulting laser light is too pure and creates these problematic image artifacts. Such artifacts are distracting and impair that user's ability to enjoy the mixed-reality scene. By broadening the spectral linewidth of the laser light (e.g., to anywhere between 2 nm and 7 nm), these undesired image artifacts will be removed entirely, or at least significantly reduced. Consequently, the user's experience will also be enhanced.

Another advantage of operating the multi-section laser in the disclosed manners is that the embodiments help considerably reduce power consumption. Very briefly, the pre-bias section of the multi-section laser is substantially smaller in size as compared to the gain/modulation section or even as compared to a single-section laser. Because of this size discrepancy, the embodiments consume much less power when biasing the laser (specifically the pre-bias section of the laser) as compared to systems that bias the large gain/modulation section or to systems that bias the entire length of the single-section laser. Consequently, substantial reductions in power may be achieved while still providing enhanced laser and laser light characteristics.

Mixed-Reality Systems

FIG. 1 shows some components that may be included within a display for a mixed-reality computing system. These components are beneficially provided to render the virtual images that were discussed earlier. Specifically, FIG. 1 shows a MEMS/laser unit 100 that includes a laser assembly 105 which functions as a projector for the mixed-reality display.

Laser assembly 105 includes a first laser 105A, a second laser 105B, and a third laser 105C. Examples of these lasers may be a red laser, a green laser, and a blue laser such that the laser assembly 105 is a red, green, blue (RGB) laser assembly having RGB lasers. While only three lasers are presently shown, it will be appreciated that laser assembly 105 may include any number of lasers. Moreover, in some embodiments, lasers 105A, 105B, and 105C may be included within their own different discrete laser assemblies.

In some embodiments, such as the one shown in FIG. 1, the laser light from the lasers 105A, 105B, and 105C is spectrally combined to form RGB laser light 110. That is, the laser light 110A from laser 105A, the laser light 110B from laser 105B, and the laser light 110C from laser 105C is spectrally combined within the laser assembly 105 to produce a single collimated beam of red, green, and blue laser light 110. It will be appreciated that laser light 110 may be a continuous beam of laser light, or, alternatively, it may be a pulsed beam of laser light. In the example shown in FIG. 1, the laser light 110 is a pulsed beam, as demonstrated by its dashed-line illustration.

The laser light 110 is then directed to a microelectromechanical scanning ("MEMS") mirror system 115. The MEMS mirror system 115 includes a multi-directional mirror array that is able to rapidly redirect and aim laser light to any desired pixel location. For example, scanning direction 120 shows how the MEMS mirror system 115 is able to rapidly redirect pulsed (or continuous) scanning laser light 125A and pulsed scanning laser light 125B to any location. Here, pulsed scanning laser light 125A and 125B originate from the laser light 110. While only two instances of the pulsed scanning laser light (e.g., 125A and 125B) are labeled, it will be appreciated that the MEMS mirror system 115 is able to redirect any number of pulsed emissions. By scanning laser light back and forth horizontally and up and down vertically, the MEMS/laser unit 100 is able to illuminate individual pixels of a virtual image within a desired field of view (to be discussed in more detail later). Because the MEMS/laser unit 100 is able to illuminate individual pixels so rapidly, the MEMS/laser unit 100 is able to render an entire virtual image for a user to view and interact with without the user realizing that the virtual image was progressively generated by scanning individual pixels.

Figure 2B:
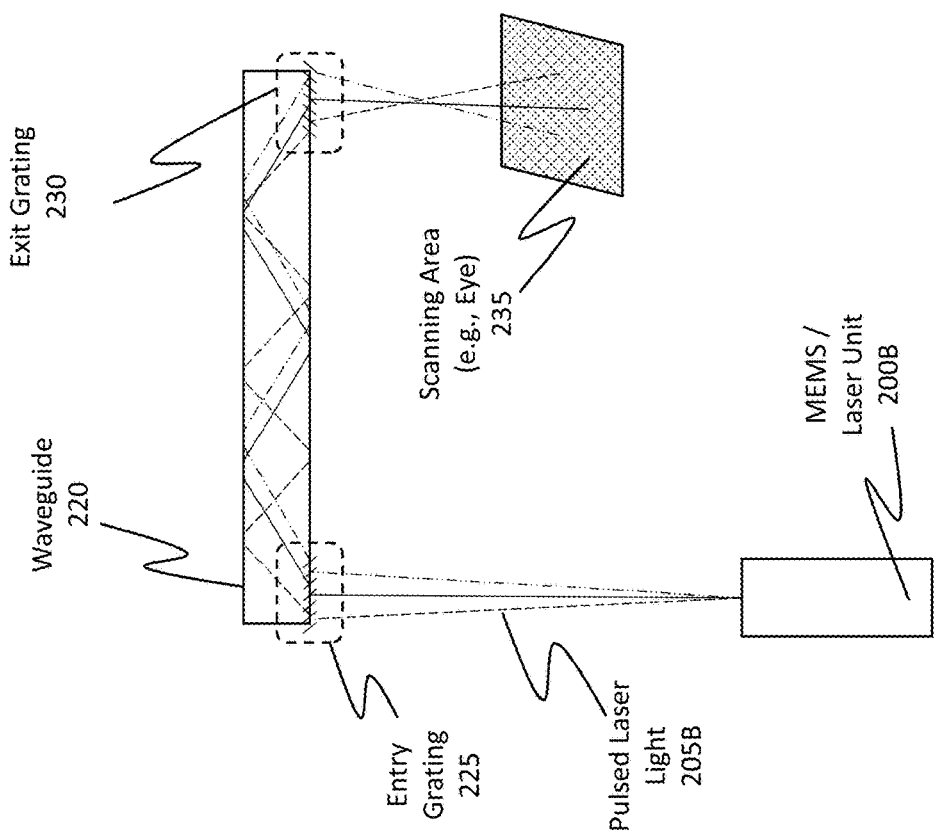
FIG. 2B illustrates an example of a MEMS/laser system being used in an AR system.
Figure 2A:
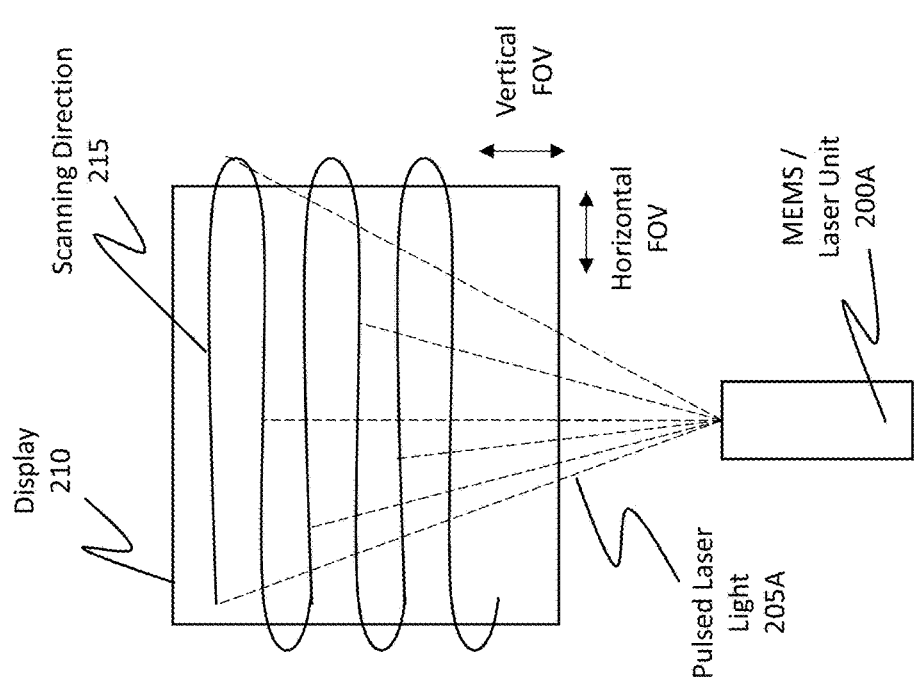
FIG. 2A illustrates an example of a MEMS/laser system being used in a VR system.

FIGS. 2A and 2B further expand on this concept by showing how a MEMS/laser unit 200A can be used in a VR environment and how a MEMS/laser unit 200B can be used in an AR environment, respectively. MEMS/laser units 200A and 200B are both example implementations of the MEMS/laser unit 100 from FIG. 1. Similarly, pulsed laser light 205A in FIG. 2A and 205B in FIG. 2B are example implementations of laser light 110 and pulsed scanning laser light 125A and 125B from FIG. 1.

In FIG. 2A, the display 210 is representative of a VR display. As described earlier, in a VR environment, the user's view of the real-world is entirely occluded such that the user is able to see only the VR environment. Here, display 210 is shown as including a vertical field of view ("FOV") and a horizontal FOV. FIG. 2A also shows the progressively backward and forward horizontal and up and down vertical scanning direction 215 in which the MEMS/laser unit 200A is able to scan individual images of a virtual image onto the display 210. By rapidly scanning/rastering the individual pixels, the MEMS/laser unit 200A is able to render an entire virtual image or even an entire VR environment.

Building on the earlier discussion, it will be appreciated that each pixel rastered on the display 210 is generated by pulsing the laser included within the MEMS/laser unit 200A. In this manner, it is possible to illuminate each pixel on display 210 in a pixel-by-pixel basis all the way from the top portion of the display 210 to the bottom portion of the display 210. Consequently, as the MEMS mirror system in the MEMS/laser unit 200A is scanned/aimed to a given pixel position on the display 210, the laser is pulsed to a determined intensity so as to properly illuminate that pixel within the overall virtual image.

FIG. 2B shows an example implementation within an AR system. Instead of scanning pixels on a display (e.g., display 210), the AR system causes its MEMS/laser unit 200B to scan pixels onto the user's eye through the use of a waveguide 220. To illustrate, FIG. 2B shows the MEMS/laser unit 200B generating pulsed laser light 205B which is directed towards the waveguide 220. This waveguide 220 includes an entry grating 225, through which the pulsed laser light 205B enters the waveguide 220, and an exit grating 230, through which the pulsed laser light 205B exits the waveguide 220. The waveguide 220 is structured to enable the pulsed laser light 205B to propagate through it so that the pulsed laser light 205B can be redirected to a desired location, such as the scanning area 235. In many instances, the scanning area 235 corresponds to a user's eye. In this regard, there is a display module (e.g., the MEMS/laser unit 200B) that shines light into a waveguide (e.g., waveguide 220). Light is then refracted along that waveguide and then coupled out of the waveguide towards the user's eye. As such, instead of scanning light onto the display 210 in the VR scenario, pulsed laser light can be scanned to a user's eye in the AR scenario.

In some instances, the disclosed waveguide is embedded with diffraction gratings that diffract the incident light onto the waveguide and towards the user's eye. Diffraction gratings are inherently sensitive to the spectral characteristics of the illumination source. These types of devices are often highly dependent on the input wavelength and spectral characteristics of the incoming light. Due to the characteristics of the disclosed waveguide, if a spectrally narrow beam of laser light were used, the resulting image will have many fringe image artifacts due to constructive and destructive interference effects of the coherent laser light (e.g., Newton Rings). As such, it is desirable to broaden out/increase the spectral linewidth of the laser light. Stated differently, if a broader range of wavelengths are included in the pulsed beam of laser light, more dispersion will result. This dispersion will beneficially lead to a more uniform virtual image (i.e. less or no fringe image artifacts).

Additionally, given a horizontal MEMS resonance frequency and a vertical field of view refresh rate (or rather, a refresh rate in the vertical direction), one factor that defines the overall resolution of the resulting virtual image is dependent on how fast the laser device can be pulsed. That is, the faster the laser can be actively pulsed, a larger number of pixels can be scanned within the same FOV, thereby resulting in virtual images with higher resolution.

Accordingly, it is desirable to design a system that achieves (1) an accelerated turn-on rate of the laser device (thereby enabling the laser device to scan more pixels in the FOV) and (2) a broadened spectral linewidth of the pulsed beam of laser light. By designing a system that achieves both of these objectives, the quality of the resulting virtual images will be substantially improved.

Structure of a Multi-Section Laser

Figure 3A:
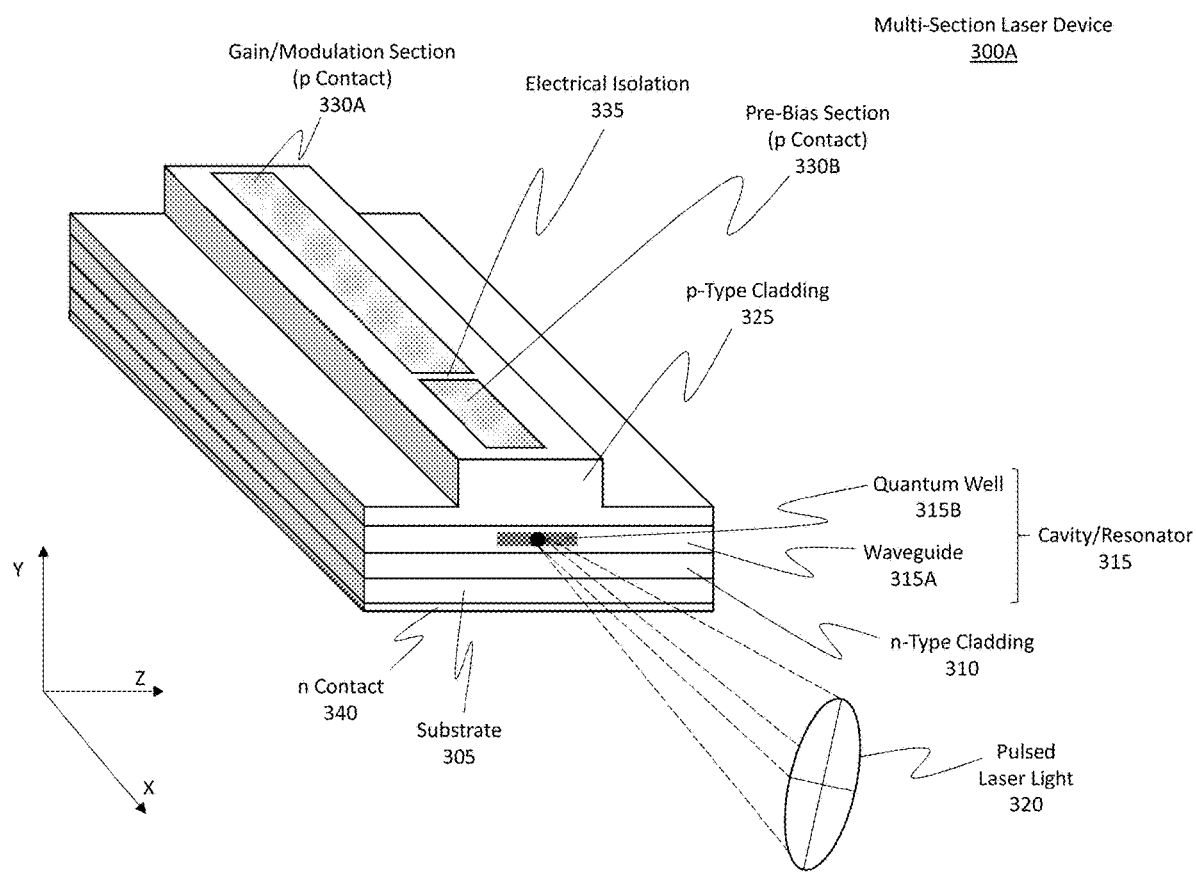
FIG. 3A illustrates some of the different components of the disclosed multi-section laser, including its gain/modulation section and its pre-bias section.

FIG. 3A shows an example illustration of a multi-section laser device 300A. This multi-section laser device 300A may be included in the MEMS/laser units 200A and 200B from FIGS. 2A and 2B, respectively, and also may be one of the lasers 105A, 105B, or 105C from FIG. 1. Furthermore, the MEMS/laser unit may include any number of these multi-section laser devices.

Multi-section laser device 300A is shown as including a substrate 305. Substrate 305 may be made of any suitable material, such as, for example gallium arsenide or gallium nitride. Layered on top of substrate 305 is an n-type cladding 310 layer. Then, there is shown a cavity/resonator 315. Cavity/resonator 315 includes a waveguide 315A and a quantum well 315B. As shown, the pulsed laser light 320 (e.g., representative of the pulsed laser light 205A and 205B from FIGS. 2A and 2B, respectively) are emitted from an output end of the cavity/resonator 315.

Multi-section laser device 300A also includes a layer of p-Type cladding 325. Forming a part of this p-Type cladding 325 is a gain/modulation section (p Contact) 330A and a pre-bias section (p contact) 330B. The gain/modulation section 330A is electrically isolated from the pre-bias section 330B by the electrical isolation 335. The electrical isolation 335 may be achieved by etching the p-Type cladding 325 to electrically separate the gain/modulation section 330A from the pre-bias section 330B. Multi-section laser device 300A also includes a common n Contact 340, which is a cathode that is common to both the gain/modulation section 330A and the pre-bias section 330B. In contrast to the common cathode, the two anode sections (i.e. the gain/modulation section 330A and the pre-bias section 330B) are electrically isolated.

Here, the gain/modulation section 330A and the pre-bias section 330B are electrically connected to the cavity/resonator 315 (also called a "diode laser resonator"). Moreover, as will be described in further detail in FIG. 3B, the gain/modulation section 330A and the pre-bias section 330B are independently controllable via laser driver circuitry.

The x-y-z legend demonstrates the general orientation of these components in relation to one another. Worthwhile to note, the cavity/resonator 315 extends the length (i.e. x-direction) of the multi-section laser device 300A.

Figure 3B:
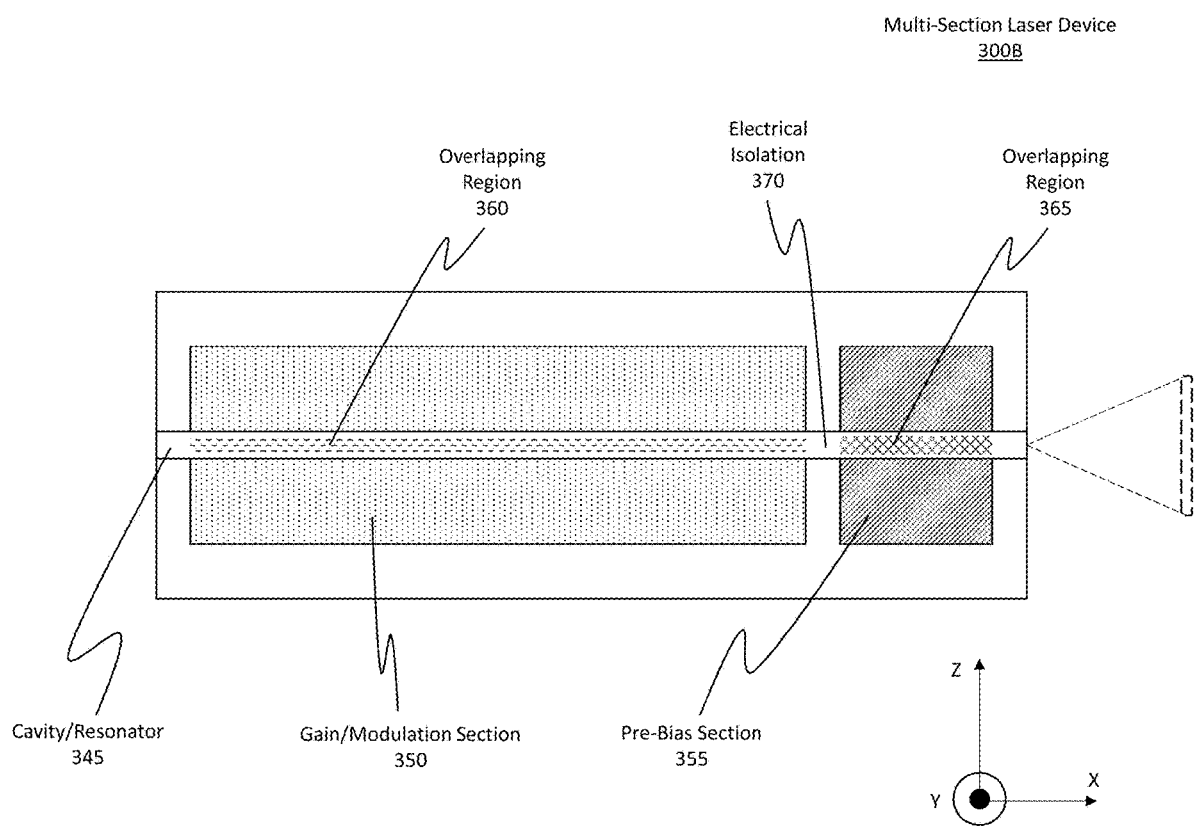
FIG. 3B illustrates a top aerial view of a multi-section laser, including its gain/modulation section and its pre-bias section.

FIG. 3B shows a top aerial view of the multi-section laser device 300B, which is representative of multi-section laser device 300A from FIG. 3A. Here, the cavity/resonator 345 is illustrated, but in reality, the cavity/resonator 345 would not be viewable from this perspective because it is a buried sublayer of the multi-section laser device 300B. Nevertheless, FIG. 3B shows the cavity/resonator 345 in order to more fully clarify its relationship with the gain/modulation section 350 and the pre-bias section 355. Also shown is a first overlapping region 360 where the cavity/resonator 345 is positioned proximate to the gain/modulation section 350 (i.e. these two components overlap with one another and are electrically connected). Additionally, there is shown a second overlapping region 365 where the cavity/resonator 345 is positioned proximately to the pre-bias section 355 and is electrically connected to the pre-bias section 355. From this, it will be appreciated that both the gain/modulation section 350 and the pre-bias section 355 are electrically connected to the cavity/resonator 345.

FIG. 3B also more fully illustrates the electrical isolation 370 present between the gain/modulation section 350 and the pre-bias section 355. Additionally, FIG. 3B more fully illustrates how the cavity/resonator 345 travels the length of the multi-section laser device 300B. The x-y-z legend shows the orientation of these components in relation to one another. While FIG. 3B shows the pre-bias section 355 as being located nearer to the output end of the multi-section laser device 300B, it will be appreciated that other configurations are possible. For instance, the gain/modulation section 350 may be located nearer to the output end. Accordingly, FIG. 3B is just one example implementation.

Figure 4:
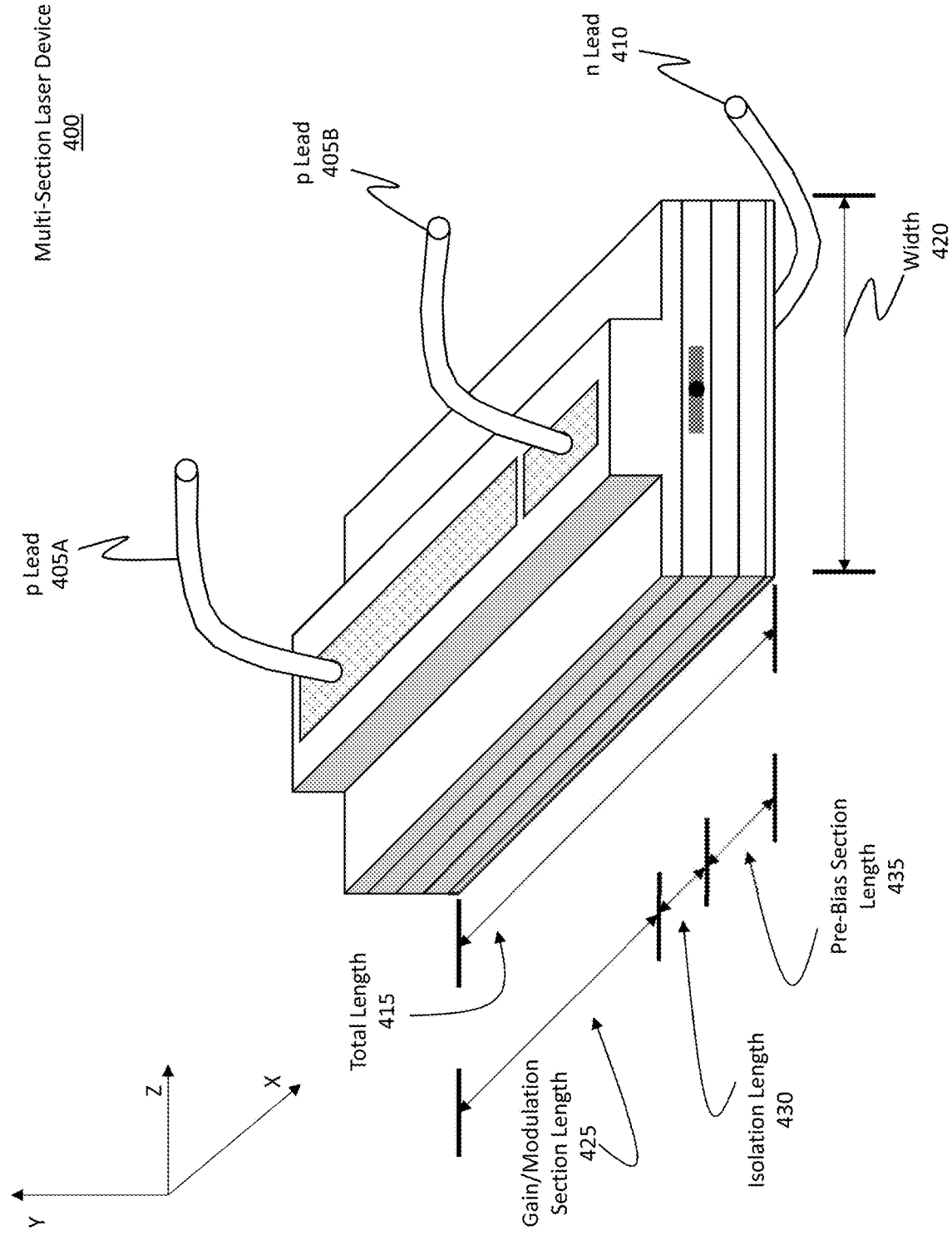
FIG. 4 illustrates additional characteristics of the multi-section laser, including some of its electrical connections.

FIG. 4 shows a multi-section laser device 400, which is representative of the multi-section laser devices discussed earlier. Here, multi-section laser device 400 is shown as having a number of different electrical leads connected to some of the different structural components. More specifically, FIG. 4 shows a first p Lead 405A connected to the gain/modulation section, a second p Lead 405B connected to the pre-bias section, and an n Lead 410 connected to the n Contact (as described in FIG. 3A). From this, it is apparent that the gain/modulation section can be controlled independently from the pre-bias section via use of the laser driver circuitry.

FIG. 4 also illustrates some of the configurable structural dimensions of the multi-section laser device 400. For example, multi-section laser device 400 includes a total length 415 in the x-direction and a width 420 in the z-direction. FIG. 4 also shows the gain/modulation section length 425, the isolation length 430, and the pre-bias section length 435.

In some embodiments, the total length 415 may be between 300 microns and 2 millimeters. Consequently, the gain/modulation section length 425 and the pre-bias section length 435 will be shorter than the total length 415. In some instances, the gain/modulation section length 425 and the pre-bias section length 435 are dimensions that can be configured or viewed as relative lengths in terms of their percentage of the total length 415. For instance, in some embodiments, the gain/modulation section length 425 will be between 50% to 90% of the total length 415. Similarly, the pre-bias section length 435 will be between 10% to 50% of the total length 415. The isolation length 430 is nominal, in some instances, and can be engineered to be any length that is adequate to sufficiently isolate or electrically insulate the gain/modulation section from the pre-bias section under normal operation.

Operating a Multi-Section Laser to Reduce Turn-on Delay

Many traditional laser devices have a single gain section over the entire length of the laser device. Consequently, there is only a single electrical connection pad on the top portion of the device. Moreover, there is a resonant cavity that is defined by the laser structure, spanning the length of the device. When current is injected into this type of device, spontaneously emitted photons are generated. Some of the spontaneously emitted photons are successfully coupled to the laser device's resonant cavity. Afterwards, because the laser device is biased above the laser threshold, the photon density starts to increase inside the resonant cavity and eventually a pulse of laser light will be emitted from the laser device.

The intensity of this pulse of laser light is the peak power multiplied by the amount of time the laser device is turned on. As an example, consider an 80 mW peak power that lasts for 4 nanoseconds. The resulting intensity will be 120 pico-Joules for that pulse of laser light.

Figure 5:
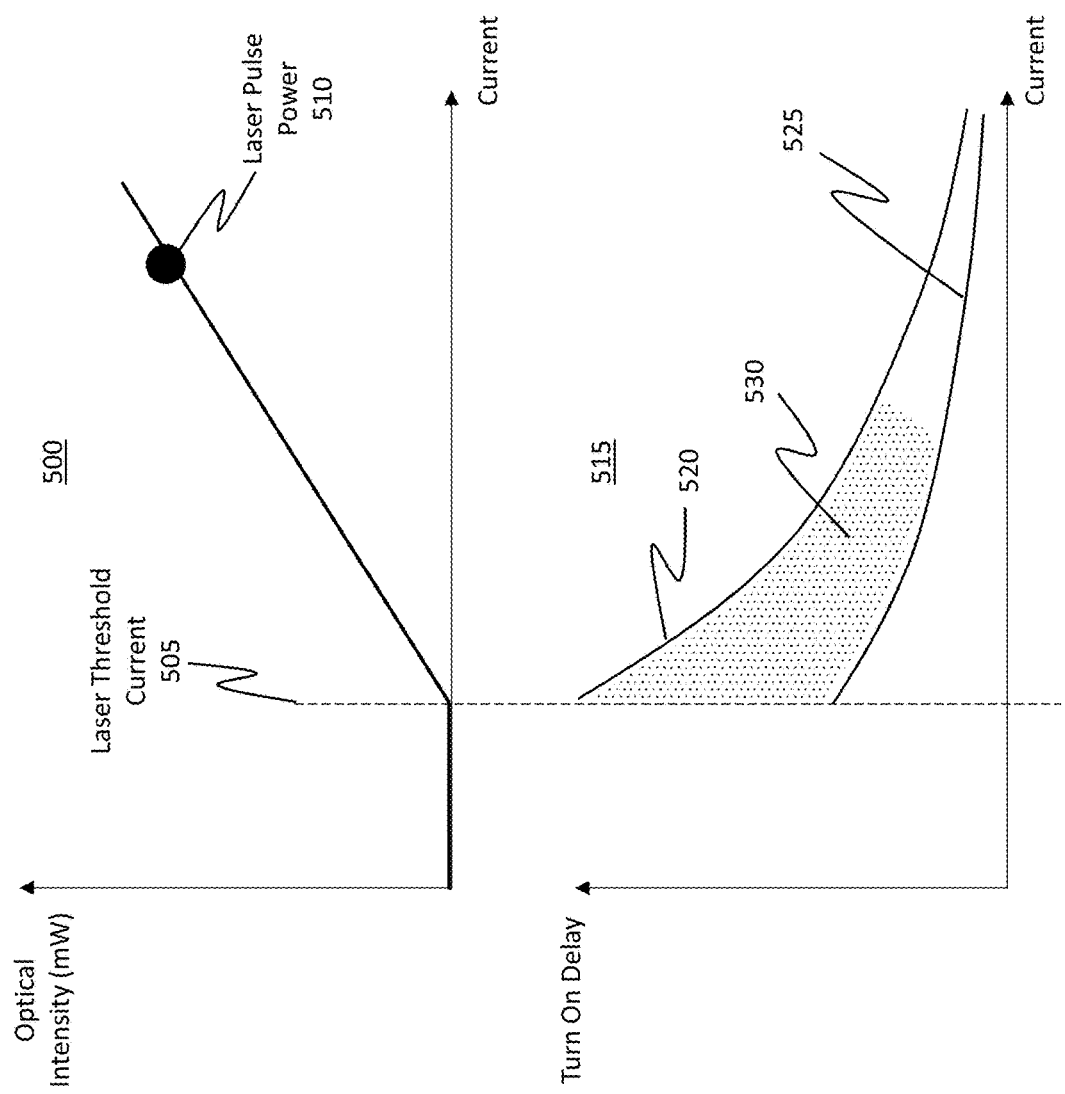
FIG. 5 illustrates a first graph showing a linear relationship between optical power and current and a second graph showing a relationship between turn-on delay and current.

FIG. 5 shows a graph 500 showing the functional relationship between optical intensity/power (in mW) to current. On graph 500, there is a point, referred to as the laser threshold current 505, where the laser will begin to lase. If this laser threshold current 505 is not satisfied (as shown by the left-hand side of graph 500), then the laser will not lase. On the other hand, if the current levels satisfy the laser threshold current 505, then the device will begin to lase. Graph 500 also shows an example laser pulse power 510 that may be used to illuminate a particular pixel. It will be appreciated that the laser pulse power 510 may be different for each pixel, depending on the desired characteristics of the corresponding virtual image.

With traditional lasers, there are a few undesirable outcomes that may occur. In particular, there can be a substantial turn-on delay associated with the amount of time it takes between when the laser device is initially biased and when photons are actually coupled to the resonant cavity. This time delay results in the laser device not being able to emit a laser beam until the photon density in the resonant cavity is sufficiently high. As described earlier, this delay results in the laser device not being able to raster as many pixels, thereby causing the virtual image to have a reduced resolution.

Graph 515 shows the functional relationship between turn-on delay and current. The line 520 corresponds to the turn-on delay for a traditional laser device. As shown, when the input current is lower (i.e. nearer the laser threshold current 505), there can be a substantial amount of turn-on delay (e.g., 5-6 nanoseconds). By following the disclosed principles (which will be discussed in more detail later), it is possible to significantly reduce this turn-on delay, as shown by the line 525, which corresponds to the reduced turn-on delay of the disclosed embodiments. Specifically, the disclosed embodiments have achieved turn-on delays of less than 1 nanosecond. The dotted region 530 emphasizes the most substantial areas where reductions in turn-on delay may be achieved (as between the disclosed embodiments and traditional laser systems). As illustrated, these improvements/enhancements are particularly pronounced for lower intensity laser pulse emissions (i.e. those closer to the laser threshold current 505). As has already been discussed, turn-on delays directly impact image resolutions.

To accelerate the turn-on rate of the laser, the disclosed embodiments use a multi-section laser (e.g., those discussed in FIGS. 3A, 3B, and 4) and initially prepare (i.e. "seed") that multi-section laser's resonant cavity by injecting photons into it without having to apply a bias to the entire length of the laser. The disclosed embodiments also improve turn-on delay while not consuming extra power. Such operations are described in the flowchart presented in FIG. 6.

Figure 6:
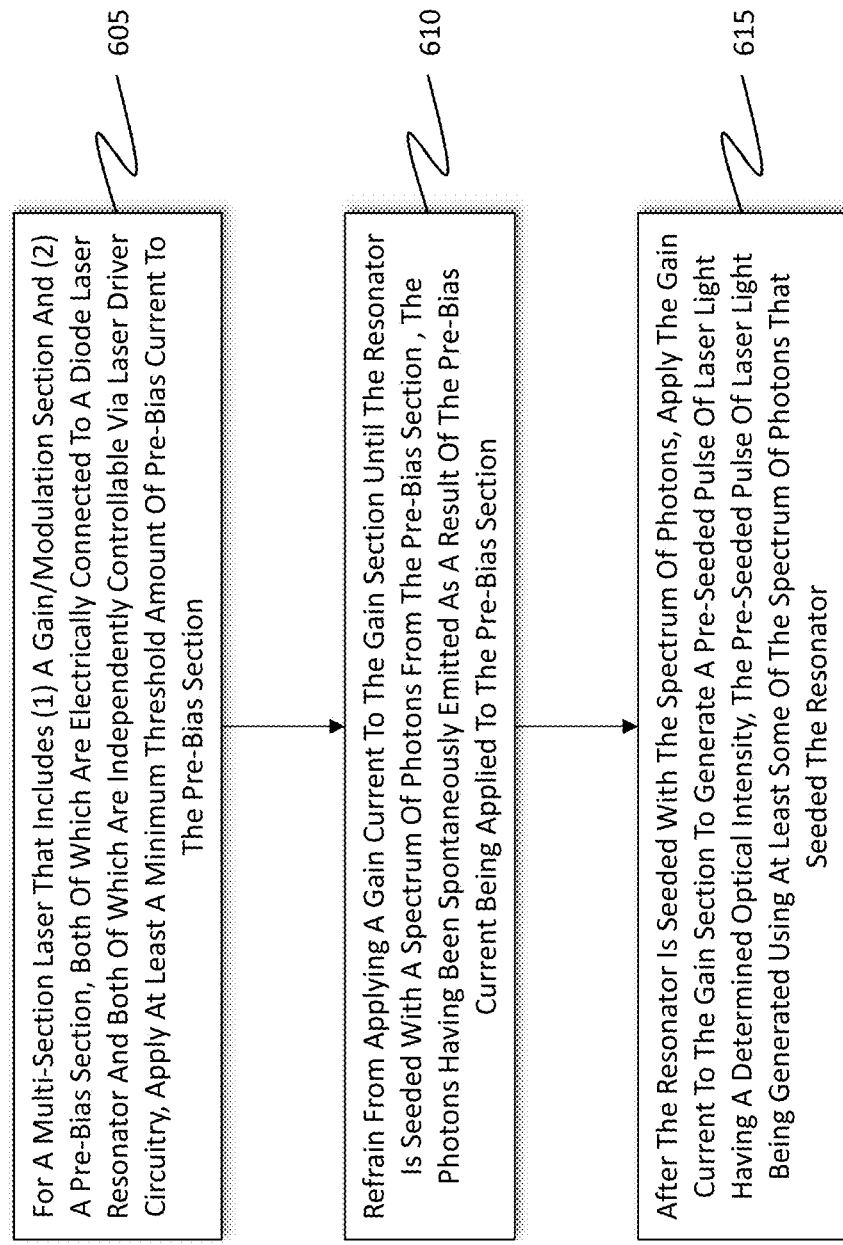
FIG. 6 illustrates an example method for reducing a multi-section laser's turn-on delay while enabling that laser to generate laser light having a broad spectral linewidth.

Accordingly, attention will now be directed to FIG. 6 which refers to a number of methods and method acts that may be performed. Although the method acts may be discussed in a certain order or illustrated in a flow chart as occurring in a particular order, no particular ordering is required unless specifically stated, or required because an act is dependent on another act being completed prior to the act being performed.

FIG. 6 shows a flowchart of an example method 600 for accelerating the turn on rate of a multi-section laser device (e.g., the multi-section laser 400 of FIG. 4) while ensuring that the resulting laser light's spectral linewidth is broad. This multi-section laser may be configured in the manner previously described. That is, it may include a gain/modulation section and a pre-bias section, where both sections are electrically connected to a diode laser resonator and are independently controllable via laser driver circuitry. In some embodiments, the same laser driver circuitry may be used to independently drive both the gain/modulation section and the pre-bias section while in other embodiments, each of those sections may have different laser driver circuitry. In this manner, at least some of these methods acts may be performed as a result of the laser driver circuitry driving the respective sections of the multi-section laser.

In act 605, at least a minimum threshold/amount of pre-bias current (corresponding to a pre-bias current density) is applied to the pre-bias section. This minimum threshold/amount of pre-bias current, when applied, causes photons to be spontaneously emitted. Through the selective control of this pre-bias current, it is possible to cause the resulting wavelengths of those spontaneously emitted photons to span a broad range of wavelengths, or at least to span a determined range of wavelengths. Here, when the minimum threshold/amount of pre-bias current is applied to the pre-bias section, then those spontaneously emitted photons are generated within the diode laser resonator, as described earlier. In some embodiments, the pre-bias current is a continuously-applied current (e.g., perhaps lasting for a selected time period between emissions) whereas in other embodiments the pre-bias current is a pulsed current. As will be discussed in more detail later, the current density applied to the pre-bias section will typically be higher than the current density applied to the main gain section for each laser pulse.

In this regard, the disclosed embodiments operate a multi-section laser in a new manner to achieve the improvements and benefits discussed earlier. That is, by applying pre-bias current initially to only the pre-bias section (as opposed to the entire laser or even to the gain/modulator section), the diode laser resonator can be initially seeded with photons. Stated differently, applying the pre-bias current causes photons to be spontaneously generated in every direction within the relatively smaller pre-bias section. A number of these spontaneously emitted photons will then be coupled into the diode laser resonator, effectively seeding it with photons.

Figure 7:
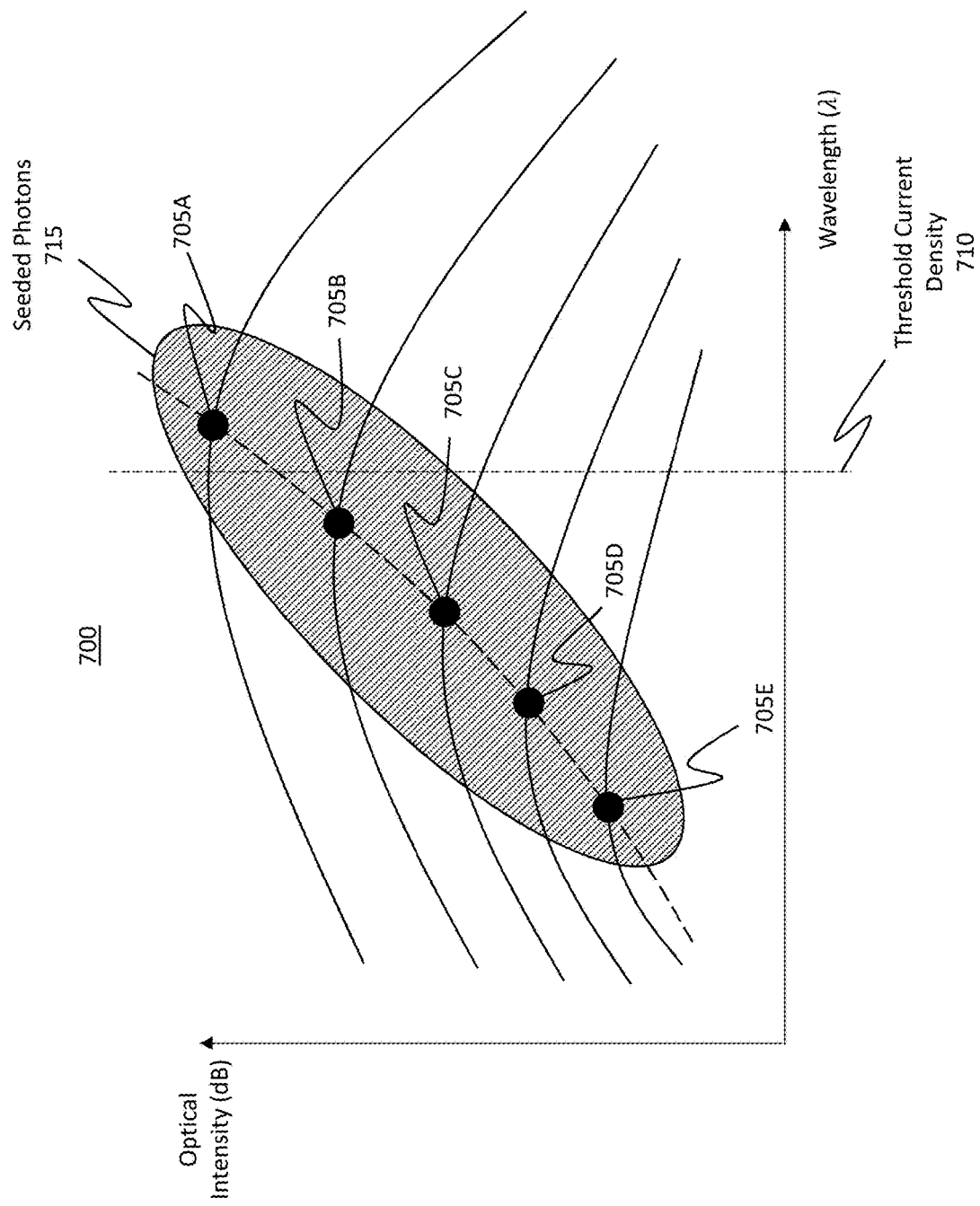
FIG. 7 illustrates a graph showing different plots of optical intensity to wavelength for different drive current density values and how it is desirable to seed certain photons (e.g., those within the peak regions) into a diode laser resonator.

Turning briefly to FIG. 7, there is shown a graph 700 illustrating the functional relationship between optical intensity (in dB) and photon wavelength (λ). As shown, there are multiple different peak wavelength/gain lines 705A, 705B, 705C, 705D, and 705E. Each of these wavelength/gain lines may correspond to a different pixel that is being illuminated or even to the same pixel but at different time periods and at different illumination intensities.

Also shown is the threshold current density 710 of the entire multi-section laser. While "threshold current" (e.g., laser threshold current 505 from FIG. 5) refers to the amount of current used to cause the laser to lase, "threshold current density" refers to the amount of current per centimeter squared of the entire laser device. According to the disclosed embodiments, the pre-bias section of the multi-section laser is pumped/driven with a current density that is equal to or more than the threshold current density 710. That is, the minimum pre-bias current density associated with the pre-bias current applied to the pre-bias section is equal to or more than the threshold current density 710 of the multi-section laser.

If the pre-bias section was pumped with a current density below the threshold current density 710, then too few photons will be coupled to the diode laser resonator and the diode laser resonator will not be adequately seeded. Furthermore, any photons that are coupled to the diode laser resonator (in the above scenario) will likely not be well mapped to where the bulk of the gain will be, as shown by the seeded photons 715 area in graph 700. It will also be appreciated that during this initial pre-biasing operation, only the pre-bias section is biased at or above the threshold current density 710.

For instance, returning to FIG. 6, during the time when the pre-bias current is being applied, the laser driver circuitry refrains/delays from applying a gain current to the gain section (act 610). This delay persists until the diode laser resonator is seeded with a spectrum of photons from the pre-bias section. The process of seeding the diode laser resonator is performed by the spectrum of photons being coupled into the diode laser resonator. In this regard, the spectrum of photons are initially coupled into the diode laser resonator without applying any bias current to the gain section. Determining when the diode laser resonator is sufficiently seeded may be performed in a number of different manners. For instance, the multi-section laser may be provided with a sensing unit that is capable to sensing the photon state of the diode laser resonator to determine when a sufficient/threshold amount of photons are present. Additionally, in some embodiments, this sensing unit may be configured to detect the photon density within the diode laser resonator. Additionally, or alternatively, some embodiments determine when the diode laser resonator is sufficiently seeded by waiting a determined period of time, where the time period is determined as a function of the amount of pre-bias current.

In some embodiments, the laser light that is emitted from the laser device is a continuous emission of laser light while in other embodiments the laser light is a pulsed stream/train of laser light. In scenarios where a pulsed train of emissions is produced, the process of refraining from applying the gain current to the gain section until the diode laser cavity is determined to be seeded with the spectrum of photons is performed only for the very first pulse in the train of pulses. After the laser starts pulsing, then some embodiments do not perform the delay because seeded photons are already present in the diode laser resonator.

After the diode laser resonator is seeded with the spectrum of photons, the laser driver circuitry applies the gain current to the gain section (act 615). Applying the gain current causes the gain section to generate a seeded pulse of laser light having a determined optical intensity (e.g., to illuminate a particular pixel for a virtual image, as described earlier). Moreover, the seeded pulse of laser light is generated using at least some of the spectrum of photons that effectively seeded the diode laser resonator. By seeding the resonator with photons, the turn-on delay of the multi-section laser will be substantially reduced, as described earlier. It will also be appreciated that driving the gain section with the gain current is performed independently of the pre-bias section being driven by the pre-bias current.

Turning briefly to FIG. 7 again, once the photons are seeded in the diode laser resonator, gain current can be applied to the gain section to produce the desired laser pulse emission. In effect, this pulse is prepared with a broad range of wavelengths that were seeded in the resonator. Such preparation substantially accelerates the generation of the laser beam. That is, by applying sufficiently high pre-bias current to result in a pre-bias current density that is above the threshold current density 710, it is possible to initially achieve one of the peak gains to the right of the threshold current density 710 line shown in FIG. 7 (e.g., peak gain 705A). Then, the gain/modulation section will be driven with a different current that has a peak gain at a different region, or rather different laser wavelength (e.g., any of the peak gains 705A, 705B, 705C, 705D, or 705E). In essence, the resulting laser light can be thought of as undergoing a cross-pollination effect where the laser light's spectral linewidth will be increased as it is seeded with one set of photons (e.g., those to the right of the threshold current density 710) and as the gain/modulation section is pumped with a different set of photons (e.g., either to the left or right of the threshold current density 710). The result is that the spectral linewidth is broadened, as described earlier (e.g., greater than 2 nm). Typically, this pre-bias current density is above the current density of the individual laser pulse.

In this regard, the disclosed embodiments are able to simultaneously achieve an accelerated turn on rate for the multi-section laser while also causing the resulting laser light's spectral linewidth to be broadened. As described above, the broadening is achieved by seeding the diode laser resonator with a broad range of photon wavelengths. Because the pulse of laser light is generated using this broad range of photon wavelengths, the pulse of laser light will also be spectrally broader than it otherwise would be.

Accordingly, in some embodiments, multiple different current densities may be relied on. For instance, a first current density corresponding to the minimum threshold amount of pre-bias current may always be set to be above the calculated threshold current density of the multi-section laser (i.e. to the right of the threshold current density 710 shown in FIG. 7). Additionally, during other times, a second current density corresponding to the gain current may be below or above the calculated threshold current density (i.e. the threshold current density 710 in FIG. 7), to thereby achieve the so-called cross-pollination effect (resulting in both the spectrally broad linewidth and the accelerated turn on rate).

While the embodiments use a minimum threshold/amount of pre-bias current to achieve at least a minimum amount of seeded photons in the diode laser resonator, it will be appreciated that they also may operate well above this minimum threshold. The only qualification on how much pre-bias current is provided to the pre-bias section is based on how much power is desired to be dissipated. For instance, by pumping more current into the pre-bias section, eventually a point of diminishing returns will be reached where performance is no longer significantly improved. As such, it is possible to design the pre-bias current input to achieve an optimal result in which at least a minimum amount of photons are seeded into the diode laser resonator while achieving maximum returns from the pre-biasing.

Accordingly, in some embodiments, the multi-section laser is included as a part of a mixed-reality computer system configured to render/raster one or more virtual images. In some embodiments, the seeded pulse of laser light is one of many seeded pulses of laser light that collectively render those virtual images. In some instances, each respective one of the seeded pulses of laser light illuminates a single pixel in each of those virtual images, as described earlier. Furthermore, the disclosed embodiments are able to perform both digital modulation and analog modulation. The digital modulation is performed by pulsing the multi-section laser to generate the multiple seeded pulses of laser light. The analog modulation is performed by controlling the optical intensity of each one of those seeded pulses of laser light (e.g., red light from a red laser, green light from a green laser, and blue light from a blue laser). In this regard, the embodiments are able to provide a pulse of energy for each pixel.

It is noted that increasing a laser's spectral envelope or linewidth is often considered undesirable for most conventional systems. However, when done properly, this modification can actually result in the unanticipated benefit of reducing the formation of undesired fringe image artifacts, as discussed earlier. For example, most fiber-based communications desire to use as high of a spectral coherence as possible (i.e. a very narrow spectral linewidth). In contrast, the disclosed embodiments actually operate to reduce coherence to bring about highly beneficial results (i.e. the elimination of the visual artifacts). As a result, the disclosed embodiments actually bring about unanticipated and counter-intuitive (but highly beneficial) results.

Accordingly, by seeding the laser's resonant cavity (i.e. the diode laser resonator) in the manner described earlier, the initial turn on delay of the laser may be reduced, thereby enabling the laser to emit laser light more quickly. This accelerated emission rate also allows the system to raster more pixels in the scanning area, thereby increasing the resulting image's resolution. By pulsing/chirping the laser in the manner described above, the embodiments are also able to reduce, or even eliminate, the occurrence of fringe image artifacts. It will be appreciated that once the laser's resonant cavity is initially seeded with photons, then successive emissions in a train of laser emissions will also be seeded, and the laser can operate substantially faster.

In some embodiments, the seeded pulse of laser light can be designed to have a spectral linewidth full width at half maximum (FWHM) of at least 2 nanometers (nm). In some embodiments, the spectral linewidth is broadened even further (e.g., between 4 nm and 5 nm).

By applying the pre-bias current to the pre-bias section in the manner disclosed, the following advantages may be realized. First, it couples a broad spectrum of photons into the diode laser resonator, effectively seeding the resonator with a broad range of wavelengths (thereby enabling the formation of a spectrally broader pulse of laser light). As an example, consider an LED. Typical LEDs have a spectral linewidth of about 30 nanometers. By pre-biasing the pre-bias section, it is possible to seed the diode laser resonator with wavelengths that also span up to about 30 nanometers. Because at least some of these broader wavelengths are then included in the resulting pulse of laser light, those broader wavelengths effectively operate to broaden the laser light's spectral linewidth.

Additionally, because the pre-bias section is substantially smaller than the gain/modulation section, less current is required to bias the laser as a whole. Stated differently, substantially less current is used to operate the smaller pre-bias section to initially seed the diode laser resonator as it otherwise would if the larger gain/modulator section were used to initially seed the diode laser resonator.

Figure 8:
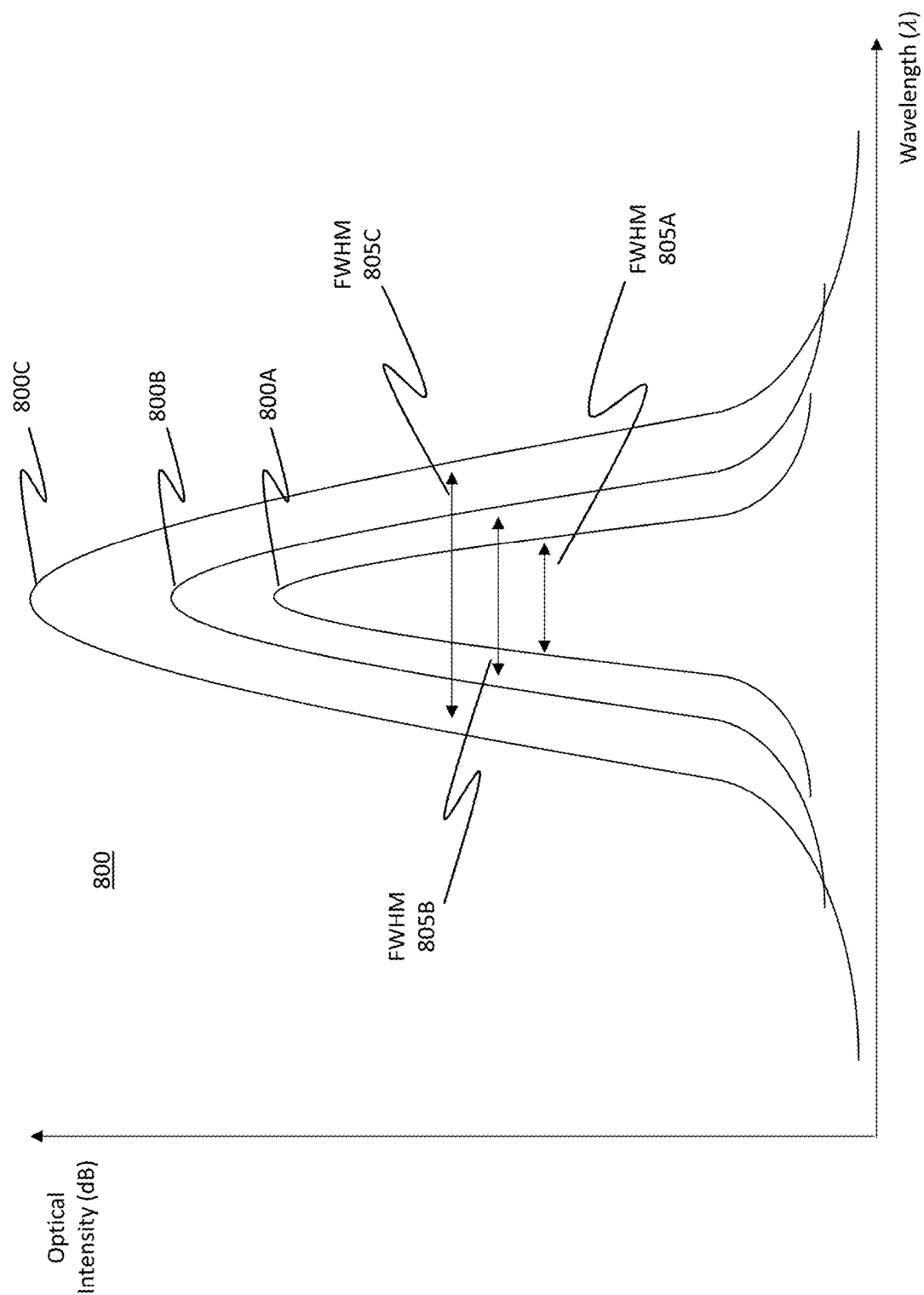
FIG. 8 illustrates the increases in spectral linewidth by operating the multi-section laser according to disclosed embodiments. The spectral characteristics are in arbitrary units and are represented linearly.

FIG. 8 shows a graph 800 of the functional relationship between optical intensity (a linear plot using arbitrary units) and wavelength. The curve 800A illustrates the spectral linewidth of traditional systems, the curve 800B illustrates the spectral linewidth of systems that operate using only a pulsing/chirping technique, and the curve 800C illustrates the spectral linewidth of systems using the disclosed principles. Here, it is shown that the full width at half maximum (FWHM) 805A of curve 800A is less than the FWHM 805B of curve 800B, which is less than the FWHM 805C of curve 800C. Accordingly, significant benefits may be achieved by operating a multi-section laser in the manner disclosed.

Example Computer System(s)

Figure 9:
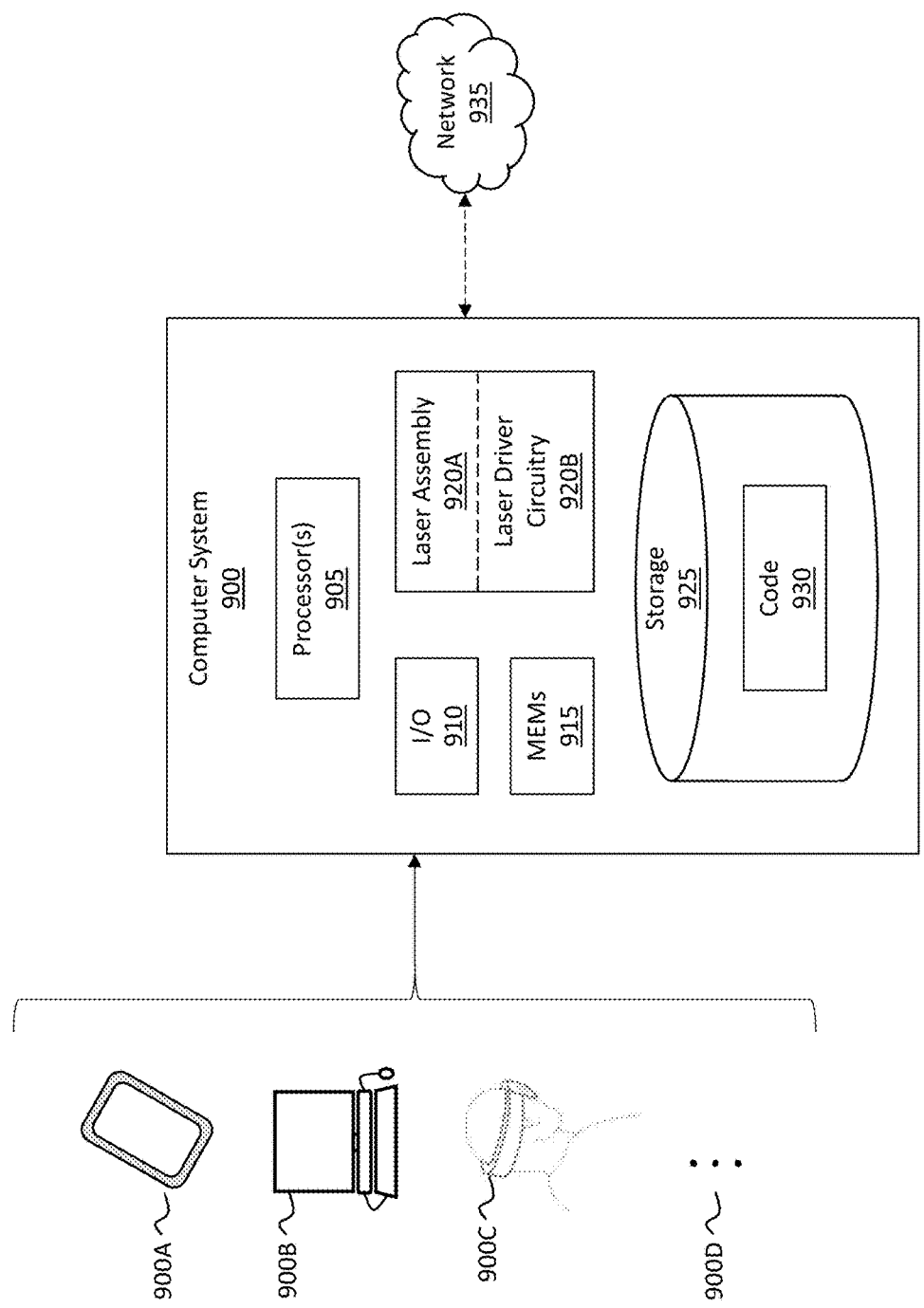
FIG. 9 illustrates an example computer system configured to perform disclosed operations.

Attention will now be directed to FIG. 9 which illustrates an example computer system 900 that may be used to facilitate the disclosed methods and/or that may comprise one of the disclosed systems. It will be appreciated that computer system 900 may be configured within various form factors. For example, computer system 900 may be embodied as a tablet 900A, a desktop 900B, or a HMD 900C. The ellipsis 900D demonstrates that computer system 900 may be embodied in various other forms too. For instance, computer system 900 may also be a distributed system that includes one or more connected computing components/devices that are in communication with computer system 900, a laptop computer, a mobile phone, a server, a data center, and/or any other computer system. The ellipsis 900D also indicates that other system subcomponents may be included or attached with the computer system 900, including, for example, sensors that are configured to detect sensor data such as user attributes (e.g., heart rate sensors), as well as sensors like cameras and other sensors that are configured to detect sensor data such as environmental conditions and location/positioning (e.g., clocks, pressure sensors, temperature sensors, gyroscopes, accelerometers and so forth), all of which sensor data may comprise different types of information used during application of the disclosed embodiments.

In its most basic configuration, computer system 900 includes various different components. For example, FIG. 9 shows that computer system 900 includes at least one processor 905 (aka a "hardware processing unit"), input/output ("I/O") engine 910, a MEMS mirror system 915, a laser assembly 920A with laser driver circuitry 920B, and storage 925.

Computer system 900 may also include a depth engine which includes any type of 3D sensing hardware to scan and generate a spatial mapping of an environment. For instance, the depth engine may include any number of time of flight cameras, stereoscopic cameras, and/or depth cameras. Using these cameras, the depth engine is able to capture images of an environment and generate a 3D representation of that environment. Accordingly, depth engine includes any hardware and/or software components necessary to generate a spatial mapping (which may include depth maps, 3D dot/point clouds, and/or 3D meshes).

Storage 925 is shown as including executable code/instructions 930. Storage 925 may be physical system memory, which may be volatile, non-volatile, or some combination of the two. The term "memory" may also be used herein to refer to non-volatile mass storage such as physical storage media. If computer system 900 is distributed, the processing, memory, and/or storage capability may be distributed as well. As used herein, the term "executable module," "executable component," or even "component" can refer to software objects, routines, or methods that may be executed on computer system 900. The different components, modules, engines, and services described herein may be implemented as objects or processors that execute on computer system 900 (e.g. as separate threads).

The disclosed embodiments may comprise or utilize a special-purpose or general-purpose computer including computer hardware, such as, for example, one or more processors (such as processor 905) and system memory (such as storage 925), as discussed in greater detail below. Embodiments also include physical and other computer-readable media for carrying or storing computer-executable instructions and/or data structures. Such computer-readable media can be any available media that can be accessed by a general-purpose or special-purpose computer system. Computer-readable media that store computer-executable instructions in the form of data are physical computer storage media. Computer-readable media that carry computer-executable instructions are transmission media. Thus, by way of example and not limitation, the current embodiments can comprise at least two distinctly different kinds of computer-readable media: computer storage media and transmission media.

Computer storage media are hardware storage devices, such as RAM, ROM, EEPROM, CD-ROM, solid state drives (SSDs) that are based on RAM, Flash memory, phase-change memory (PCM), or other types of memory, or other optical disk storage, magnetic disk storage or other magnetic storage devices, or any other medium that can be used to store desired program code means in the form of computer-executable instructions, data, or data structures and that can be accessed by a general-purpose or special-purpose computer.

Computer system 900 may also be connected (via a wired or wireless connection) to external sensors (e.g., one or more remote cameras, accelerometers, gyroscopes, acoustic sensors, magnetometers, etc.). Further, computer system 900 may also be connected through one or more wired or wireless networks 935 to remote systems(s) that are configured to perform any of the processing described with regard to computer system 900.

During use, a user of computer system 900 is able to perceive information (e.g., a mixed-reality environment) through a display screen that is included with the I/O engine 910 of computer system 900 and that is visible to the user. The I/O interface(s) and sensors with the I/O engine 910 also include gesture detection devices, eye trackers, and/or other movement detecting components (e.g., cameras, gyroscopes, accelerometers, magnetometers, acoustic sensors, global positioning systems ("GPS"), etc.) that are able to detect positioning and movement of one or more real-world objects, such as a user's hand, a stylus, and/or any other object(s) that the user may interact with while being immersed in the scene.

A graphics rendering engine may also be configured, with processor 905, to render one or more virtual objects within a mixed-reality scene/environment. As a result, the virtual objects accurately move in response to a movement of the user and/or in response to user input as the user interacts within the virtual scene.

A "network," like the network 935 shown in FIG. 9, is defined as one or more data links and/or data switches that enable the transport of electronic data between computer systems, modules, and/or other electronic devices. When information is transferred, or provided, over a network (either hardwired, wireless, or a combination of hardwired and wireless) to a computer, the computer properly views the connection as a transmission medium. Computer system 900 will include one or more communication channels that are used to communicate with the network 935. Transmissions media include a network that can be used to carry data or desired program code means in the form of computer-executable instructions or in the form of data structures. Further, these computer-executable instructions can be accessed by a general-purpose or special-purpose computer. Combinations of the above should also be included within the scope of computer-readable media.

Upon reaching various computer system components, program code means in the form of computer-executable instructions or data structures can be transferred automatically from transmission media to computer storage media (or vice versa). For example, computer-executable instructions or data structures received over a network or data link can be buffered in RAM within a network interface module (e.g., a network interface card or "NIC") and then eventually transferred to computer system RANI and/or to less volatile computer storage media at a computer system. Thus, it should be understood that computer storage media can be included in computer system components that also (or even primarily) utilize transmission media.

Computer-executable (or computer-interpretable) instructions comprise, for example, instructions that cause a general-purpose computer, special-purpose computer, or special-purpose processing device to perform a certain function or group of functions. The computer-executable instructions may be, for example, binaries, intermediate format instructions such as assembly language, or even source code. Although the subject matter has been described in language specific to structural features and/or methodological acts, it is to be understood that the subject matter defined in the appended claims is not necessarily limited to the described features or acts described above. Rather, the described features and acts are disclosed as example forms of implementing the claims.

Those skilled in the art will appreciate that the embodiments may be practiced in network computing environments with many types of computer system configurations, including personal computers, desktop computers, laptop computers, message processors, hand-held devices, multi-processor systems, microprocessor-based or programmable consumer electronics, network PCs, minicomputers, mainframe computers, mobile telephones, PDAs, pagers, routers, switches, and the like. The embodiments may also be practiced in distributed system environments where local and remote computer systems that are linked (either by hardwired data links, wireless data links, or by a combination of hardwired and wireless data links) through a network each perform tasks (e.g. cloud computing, cloud services and the like). In a distributed system environment, program modules may be located in both local and remote memory storage devices.

Additionally, or alternatively, the functionality described herein can be performed, at least in part, by one or more hardware logic components (e.g., the processor 905). For example, and without limitation, illustrative types of hardware logic components that can be used include Field-Programmable Gate Arrays (FPGAs), Program-Specific or Application-Specific Integrated Circuits (ASICs), Program-Specific Standard Products (ASSPs), System-On-A-Chip Systems (SOCs), Complex Programmable Logic Devices (CPLDs), Central Processing Units (CPUs), and other types of programmable hardware.

The present invention may be embodied in other specific forms without departing from its spirit or characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A computer system comprising:
   a multi-section laser that includes a gain/modulation section and a pre-bias section, both sections are electrically connected to a diode laser resonator and both sections are independently controllable via laser driver circuitry;
   one or more processors; and
   one or more computer-readable hardware storage devices having stored thereon computer-executable instructions that are executable by the one or more processors to cause the computer system to control the laser driver circuitry to reduce a turn-on delay of the multi-section laser while enabling the multi-section laser to generate laser light having a spectral linewidth satisfying a threshold linewidth requirement by causing the computer system to:
   apply at least a minimum amount of pre-bias current to the pre-bias section, wherein the at least the minimum threshold amount of pre-bias current, when applied, causes photons to be spontaneously emitted, and wherein wavelengths of the spontaneously emitted photons span at least a determined range of wavelengths as a result of the at least the minimum threshold amount of pre-bias current being applied;
   refrain from applying a gain current to the gain section until the diode laser resonator is seeded with a spectrum of photons from the pre-bias section; and
   after the diode laser resonator is seeded with the spectrum of photons, apply the gain current to the gain section to generate a seeded pulse of laser light having a determined optical intensity, wherein the seeded pulse of laser light is generated using one or more photons from the spectrum of photons that seeded the diode laser resonator.

2. The computer system of claim 1, wherein, when the at least the minimum amount of pre-bias current is applied to the pre-bias section, the spontaneously emitted photons are generated within the diode laser resonator.

3. The computer system of claim 2, wherein seeding the diode laser resonator is performed by the spectrum of photons being coupled into the diode laser resonator.

4. The computer system of claim 1, wherein the computer system is a mixed-reality computer system configured to render one or more virtual images, wherein the seeded pulse of laser light is one of a plurality of seeded pulses of laser light that collectively render the one or more virtual images, and wherein each respective one seeded pulse of laser light in the plurality of seeded pulses of laser light illuminates a single pixel in each of the rendered one or more virtual images.

5. The computer system of claim 1, wherein the seeded pulse of laser light has a spectral linewidth full width at half maximum (FWHM) of at least 2 nanometers (nm).

6. The computer system of claim 5, wherein the seeded pulse of laser light's spectral linewidth FWHM is between 4 nm and 5 nm.

7. The computer system of claim 1, wherein a minimum pre-bias current density associated with the pre-bias current is equal to or more than a threshold current density of the multi-section laser.

8. The computer system of claim 1, wherein the turn-on delay of the multi-section laser is less than or equal to 1 nanosecond.

9. The computer system of claim 1, wherein the pre-bias section occupies between 10% and 30% of the length of the multi-section laser.

10. The computer system of claim 1, wherein the pre-bias current is either a pulsed current or a continuously-applied current.

11. A method for reducing a turn-on delay of a multi-section laser while enabling the multi-section laser to generate laser light having a spectral linewidth that satisfies a threshold linewidth requirement, the multi-section laser includes a gain/modulation section and a pre-bias section, both sections are electrically connected to a diode laser resonator and both sections are independently controllable via laser driver circuitry, the method comprising:
  applying at least a minimum threshold amount of pre-bias current to the pre-bias section, wherein the at least the minimum threshold amount of pre-bias current, when applied, causes photons to be spontaneously emitted, and wherein wavelengths of the spontaneously emitted photons span at least a determined range of wavelengths as a result of the at least the minimum threshold amount of pre-bias current being applied;
  refraining from applying a gain current to the gain section until the diode laser resonator is seeded with a spectrum of photons from the pre-bias section; and
  after the diode laser resonator is seeded with the spectrum of photons, applying the gain current to the gain section to generate a seeded pulse of laser light having a determined optical intensity, wherein the seeded pulse of laser light is generated using one or more photons from the spectrum of photons that seeded the diode laser resonator.

12. The method of claim 11, wherein a first current density corresponding to the minimum threshold amount of the pre-bias current is always above a calculated threshold current density of the multi-section laser, and wherein, during at least some times, a second current density corresponding to the gain current is below the calculated threshold current density.

13. The method of claim 11, wherein a length of the multi-section laser is between 300 microns and 2 millimeters, and wherein a length of the pre-bias section is between 10% and 50% of the length of the multi-section laser.

14. The method of claim 11, wherein the multi-section laser is structured to include a common cathode between the gain section and the pre-bias section, and wherein an anode of the gain section is electrically isolated from an anode of the pre-bias section.

15. The method of claim 11, wherein the multi-section laser includes one or more red lasers, one or more green lasers, or one or more blue lasers.

16. The method of claim 11, wherein the seeded pulse of laser light is one of a plurality of seeded pulses of laser light, and wherein the method further includes:
  performing digital modulation by pulsing the multi-section laser to generate the plurality of seeded pulses of laser light; and
  performing analog modulation by controlling the determined optical intensity of the seeded pulse of laser light as well as a corresponding optical intensity for each respective one seeded pulse of laser light included in the plurality of seeded pulses of laser light.

17. The method of claim 11, wherein the spectrum of photons are initially coupled into the diode laser resonator without applying a bias to the gain section.

18. The method of claim 11, wherein refraining from applying the gain current to the gain section until the diode laser resonator is determined to be seeded with the spectrum of photons is performed only for a first pulse in a train of pulses such that the refraining is a one-time delay in which application of the gain current to the gain section is delayed.

19. A head mounted device (HMD) comprising:
  a multi-section laser that includes a gain/modulation section and a pre-bias section, both sections are electrically connected to a diode laser resonator and both sections are independently controllable via laser driver circuitry;
  a microelectromechanical (MEMs) scanning mirror system;
  one or more processors; and
  one or more computer-readable hardware storage devices having stored thereon computer-executable instructions that are executable by the one or more processors to cause the computer system to reduce a turn-on delay of the multi-section laser while enabling the multi-section laser to generate laser light having a spectral linewidth that satisfies a threshold linewidth requirement by causing the computer system to:
  apply at least a minimum threshold amount of pre-bias current to the pre-bias section, wherein the at least the minimum threshold amount of pre-bias current, when applied, causes photons to be spontaneously emitted, and wherein wavelengths of the spontaneously emitted photons span at least a determined range of wavelengths as a result of the at least the minimum threshold amount of pre-bias current being applied;
  refrain from applying a gain current to the gain section until the diode laser resonator is seeded with a spectrum of photons from the pre-bias section; and
  after the diode laser resonator is seeded with the spectrum of photons, apply the gain current to the gain section to generate a seeded pulse of laser light having a determined optical intensity, wherein the seeded pulse of laser light is generated using one or more photons from the spectrum of photons that seeded the diode laser resonator.

20. The HMD of claim 19, wherein the gain section being driven by the gain current is performed independently of the pre-bias section being driven by the pre-bias current.

* * * * *